(12) United States Patent
Lim et al.

(10) Patent No.: US 6,882,580 B2
(45) Date of Patent: Apr. 19, 2005

(54) MEMORY DEVICES HAVING POWER SUPPLY ROUTING FOR DELAY LOCKED LOOPS THAT COUNTERACTS POWER NOISE EFFECTS

(75) Inventors: Hyun-wook Lim, Kyungki-do (KR); Dae-hyun Chung, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 169 days.

(21) Appl. No.: 10/358,739

(22) Filed: Feb. 5, 2003

(65) Prior Publication Data

US 2003/0156462 A1 Aug. 21, 2003

(30) Foreign Application Priority Data

Feb. 18, 2002 (KR) .......................... 2002-8474

(51) Int. Cl.[7] ................................ G11C 7/00
(52) U.S. Cl. ................ 365/189.05; 327/156; 365/194
(58) Field of Search ................ 365/189.05, 194; 327/158, 156, 155

(56) References Cited

U.S. PATENT DOCUMENTS 6,008,680 A * 12/1999 Kyles et al. ............. 327/277
6,288,585 B1 * 9/2001 Bando et al. ............. 327/156
6,727,739 B1 * 4/2004 Stubbs et al. ............. 327/161

FOREIGN PATENT DOCUMENTS

TW     323352     12/1997

OTHER PUBLICATIONS

Decision of the Intellectual Property Office, Taiwanese Application No. 092102657, Mar. 17, 2004.

* cited by examiner

Primary Examiner—Richard Elms
Assistant Examiner—N. Nguyen
(74) Attorney, Agent, or Firm—Myers Bigel Sibley & Sajovec PA (57) ABSTRACT

A memory device includes first and second power supply pads configured to be connected to a power supply. The memory device further includes a data output circuit that receives power via the first power supply pad and outputs data responsive to an internal clock signal, and a delay-locked loop (DLL) circuit that receives power via the second power supply pad independently of the first power supply pad and that generates the internal clock signal responsive to an external clock signal.

16 Claims, 7 Drawing Sheets

MEMORY DEVICES HAVING POWER SUPPLY ROUTING FOR DELAY LOCKED LOOPS THAT COUNTERACTS POWER NOISE EFFECTS

RELATED APPLICATION

This application claims priority to Korean Patent Application 2002-8474, filed on Feb. 18, 2002, the contents of which are herein incorporated by reference in their entirety.

BACKGROUND OF THE INVENTION

The present invention relates to semiconductor (integrated circuit) memory devices, and more particularly, to semiconductor memory devices having a delay locked loop (DLL) for synchronizing output data to a clock.

A typical DLL locks data output from a semiconductor memory device to an external clock signal. The DLL compares its output signal with the external clock signal, and increases or decreases its delay time to lock the output data to the external clock signal, so that the output timing of the data substantially matches that of the external clock. In order to precisely lock the output data of the memory device to the external clock, it is often necessary to estimate the delay in a data output path and compensate for the delay in a feedback loop of the DLL.

A compensation delay is located in the feedback loop of the DLL to compensate for the delay in the data output path. The compensation delay is typically formed of inverters using a series of resistors and capacitors. In some conventional circuits, the same circuits as those in the data output path are used in the compensation delay, so as to precisely compensate for the delay.

Figure 1:
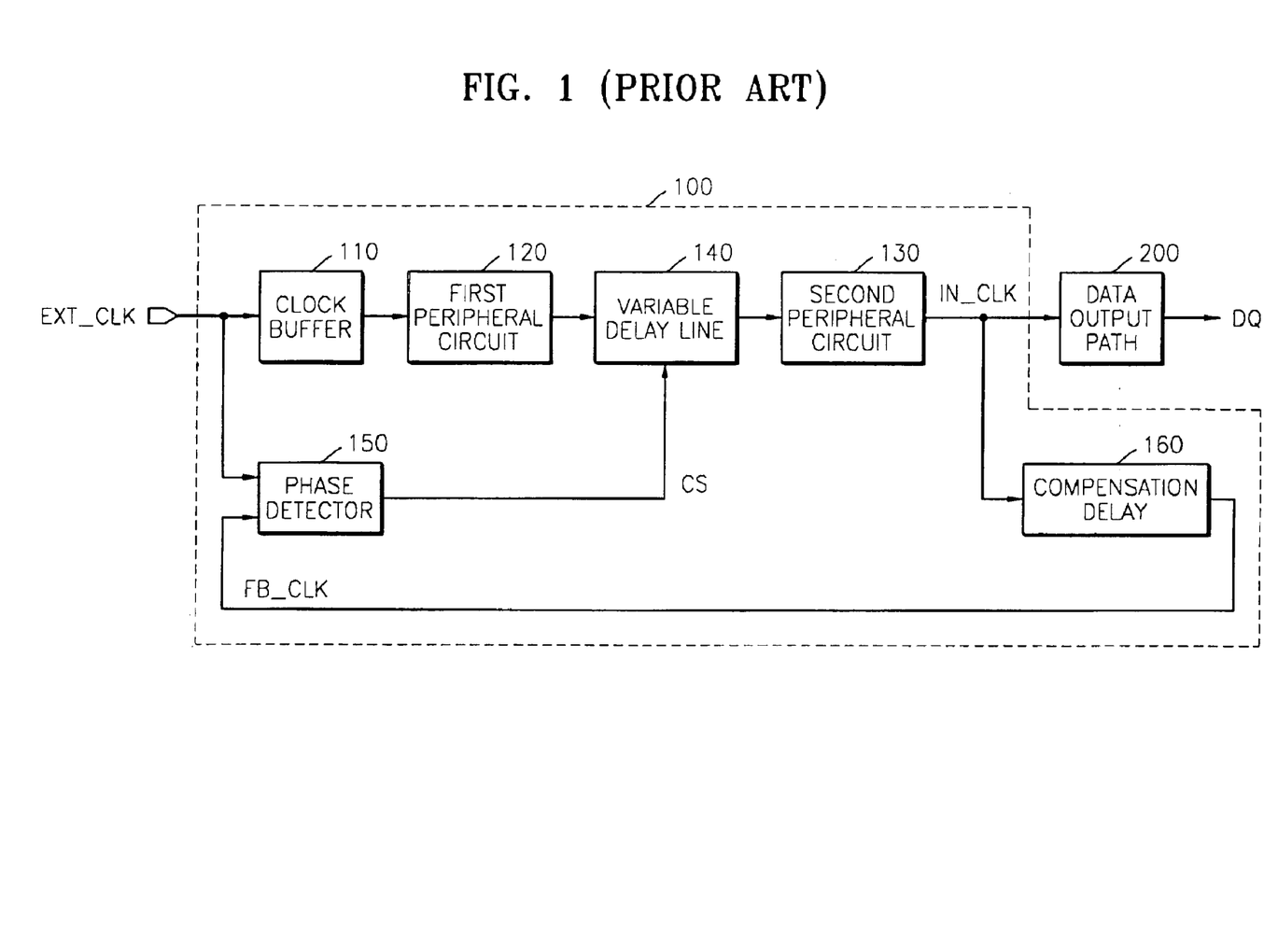
FIG. 1 is a block diagram illustrating a semiconductor memory device having a typical conventional delay locked loop (DLL)

FIG. 1 is a block diagram illustrating a conventional semiconductor memory device having a typical DLL 100. Referring to FIG. 1, the typical DLL 100 includes: a clock buffer 110; first and second peripheral circuits 120 and 130; a variable delay line 140; a phase detector 150; and a compensation delay 160. In addition, the semiconductor memory device has a data output path 200 for outputting data.

An external clock EXT_CLK is applied to the clock buffer 110. The signal responsively produced by the clock buffer 110 is applied to the first peripheral circuit 120 that produces an output with an adjusted level with respect to the external clock EXT_CLK. The variable delay line 140 introduces a variable delay according to a control signal CS generated by the phase detector 150. The delayed clock signal from the variable delay line 140 is applied to the second peripheral circuit 130, which generates an internal clock IN_CLK.

The internal clock IN_CLK is input to the data output path 200, which is a circuit formed of a driver and latch element for outputting the data. The data output path 200 locks the data output from a memory cell to the internal clock IN_CLK and outputs the data to outside through a data pin. The internal clock IN_CLK is fed back to the phase detector 150 via the compensation delay 160 to allow precise locking to the external clock EXT_CLK, so that a feedback loop is formed. The phase detector 150 compares the phases of the external clock EXT_CLK and a feedback clock FB_CLK, to precisely lock the DLL 100.

Accordingly, it is most preferable that the delay times of the data output path 200 and compensation delay 160 are substantially the same, such that the phases of the external clock EXT_CLK and output data DQ are substantially equal. Ideally, the DLL maintains a uniform locking state regardless of changes in temperature and voltage and is insensitive to noise in the external clock EXT_CLK and internal power supply.

FIGS. 2A through 2D illustrate the operation of the typical DLL 100 shown in FIG. 1 while varying the internal power supply of the semiconductor memory device. Dotted lines shown in FIGS. 2A through 2D illustrate the phases at which the phases of the external clock EXT_CLK and output data DQ are substantially identical, and solid lines illustrate the phases at which the phases of the external clock EXT_CLK and output data DQ are substantially different.

Figure 2A:
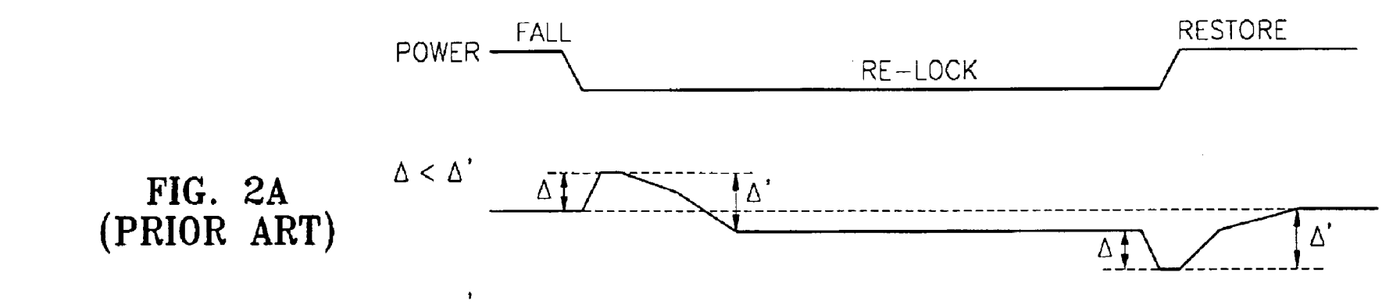
FIGS. 2A through 2D illustrate the operation of the typical DLL shown in FIG. 1 while varying an internal power supply in the semiconductor memory device.

FIG. 2A illustrates a case where the variation $\Delta$ of delay in the data output path 200 is smaller than the variation $\Delta'$ of delay in the compensation delay 160, showing a momentary response to a reduction in power supply voltage. When the power supply level decreases, jitter having a magnitude of $\Delta$ is generated. After a plurality of clock cycles, the DLL 100 is re-locked, and the jitter varies by $\Delta'$ as the power supply level is restored. The locking operation is completed after several more clock cycles. Consequently, jitter having a variation of $\Delta+\Delta'$ is generated while the power supply decreases and then is restored.

Figures 2B, 2C, 2D:
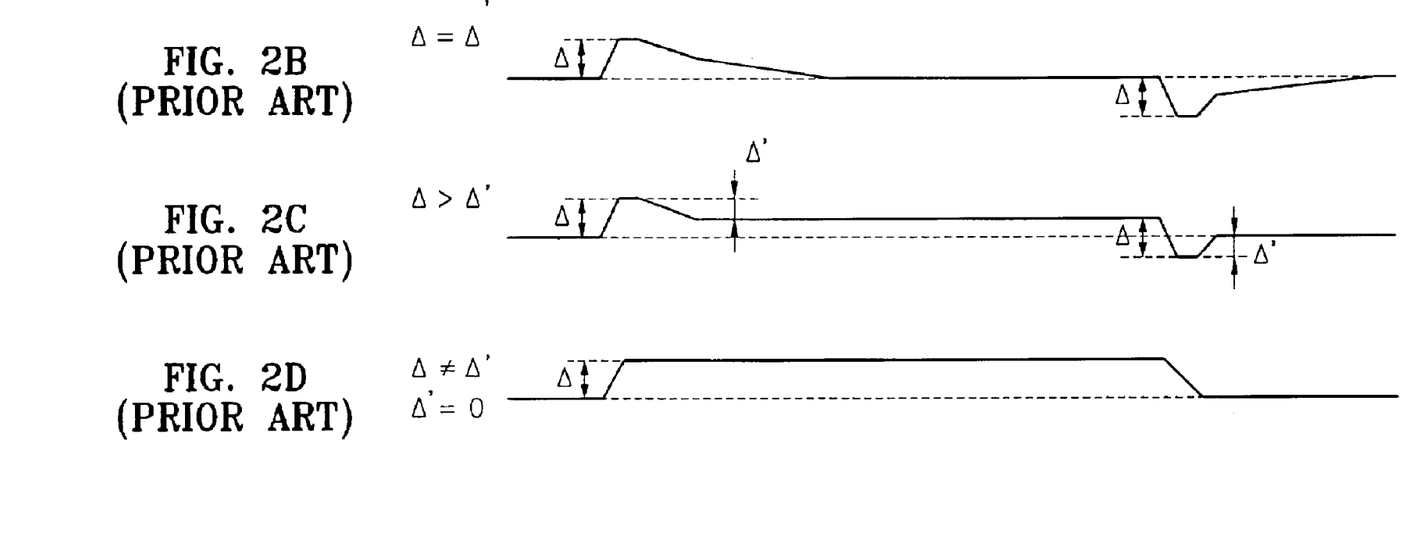

FIG. 2B illustrates a case where the variation $\Delta$ and $\Delta'$ of delays in the data output path 200 and compensation delay 160 are the same, showing a response to a momentary reduction in power supply level. In this case, jitter having a variation of $\Delta+\Delta'$, namely $2\Delta$, is generated, which is less than the jitter shown in FIG. 2A.

FIG. 2C illustrates a case where the variation $\Delta$ of delay in the data output path 200 is greater than the variation $\Delta'$ of delay in the compensation delay 160, showing a response to a momentary reduction in power supply level. In this case, jitter having a variation of $\Delta+\Delta'$ is generated, which is less than the jitter shown in FIGS. 2A and 2B.

FIG. 2D illustrates a case where the variation $\Delta'$ of delay in the compensation delay 160 is substantially zero. In this case, jitter having a magnitude of $\Delta$ is generated as power level first falls and then is restored. This is the least jitter of the cases shown in FIGS. 2A through 2D. In order to minimize performance loss caused by noise in the internal power supply, it is desirable that the variation of the delay in the compensation delay 160 by noise in the power supply minimized, as in FIG. 2D.

Figure 3:
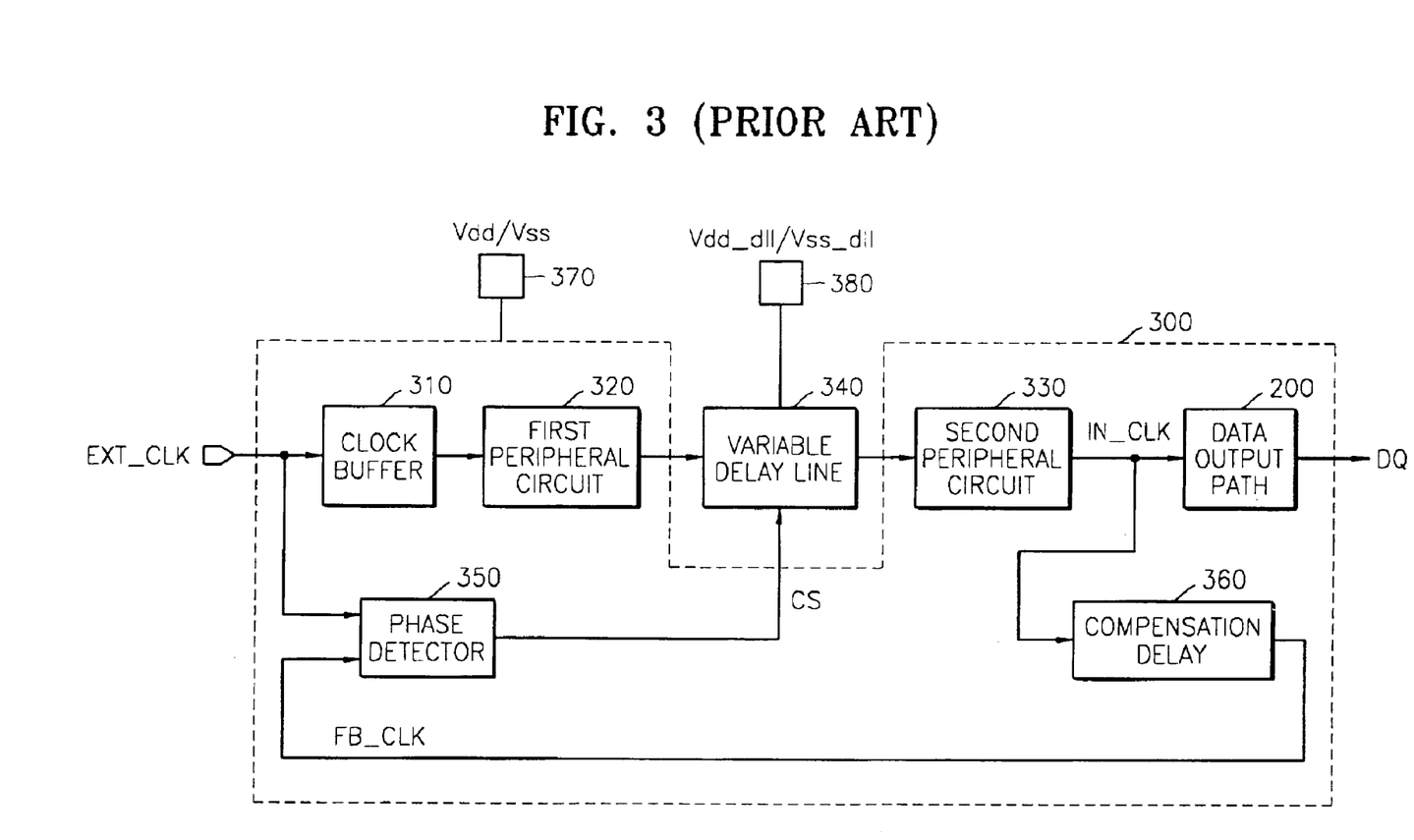
FIG. 3 is a block diagram illustrating a semiconductor memory device having a conventional DLL.

FIG. 3 is a block diagram illustrating a conventional semiconductor memory device having a conventional DLL. Referring to FIG. 3, the DLL includes: a clock buffer 310; a variable delay line 340; first and second peripheral circuits 320 and 330; a phase detector 350; and a compensation delay 360. In addition, the DLL further includes a data output path 200 for outputting data.

The variable delay line 340 receives power supply voltage Vdd_dll/Vss_dll through a separate power pin (not shown) and/or a pad 380, in order to reject noise from other peripheral circuits. Other peripheral circuitry 300 receives power Vdd/Vss through a peripheral circuitry power pad 370. Typically, as the number of output pins connected to the output data path 200 increases, power dissipation is greatly increased, causing large power loss and noise. In addition, the noise generated by the data output path 200 can flow into the compensation delay 360 and the clock buffer 310, which uses the same power supply path as the data output path 200. This can cause jitter. It is desirable that power loss and noise generated in the data output path 200 be prevented from significantly affecting the peripheral circuitry of the DLL.

SUMMARY OF THE INVENTION

According to some embodiments of the present invention, a memory device includes first and second power supply pads configured to be connected to a power supply. The memory device further includes a data output circuit that receives power via the first power supply pad and outputs data responsive to an internal clock signal, and a delay-locked loop (DLL) circuit that receives power via the second power supply pad independently of the first power supply pad and that generates the internal clock signal responsive to an external clock signal.

In some embodiments, the first and second power supply pads are coupled to respective first and second power supply pins by respective first and second lead frames. In other embodiments, the first and second power supply pads are coupled to the same output pin via respective first and second lead frames.

In further embodiments, the memory device further includes a third power supply pad configured to be connected to a power supply. The DLL circuit includes a variable delay circuit that receives power via the third power supply pad and that variably delays the internal clock signal with respect to the external clock signal responsive to a comparison of the external clock signal and the internal clock signal. In still further embodiments, the DLL circuit further includes a compensation delay circuit that produces a feedback clock signal responsive to a delayed clock signal produced by the variable delay circuit, and a phase detector circuit that generates a delay control signal responsive to a comparison of the feedback clock signal and the external clock signal. The variable delay circuit variably delays the internal clock signal with respect to the external clock signal responsive to the delay control signal, and the compensation delay circuit and the phase detector circuit are powered via the second power supply pad.

In additional embodiments of the present invention, first and second power supply pads are coupled to a first power supply pin by respective first and second lead frames, and the third power supply pad is coupled to a second power supply pin by a third lead frame. In other embodiments, the first, second and third power supply pads are coupled to respective first, second and third power supply pins by respective first, second and third lead frames. In still further embodiments, the first, second and third power supply pins are coupled to the same power supply pin by respective first, second and third lead frames.

According to additional aspects of the present invention, a semiconductor memory device includes a data output path that receives an internal clock and data to be output and that synchronizes the data to the internal clock and outputs the synchronized data. The device further includes a delay locked loop (DLL) that receives an external clock and generates the internal clock therefrom, the DLL including a variable delay line which delays the internal clock with respect to the external clock in response to a delay control signal and DLL peripheral circuitry that generates the delay control signal from the external clock and a feedback clock that is derived from the internal clock and compensated for delay time of the data output path. The variable delay line receives dedicated power for the variable delay line, and the DLL peripheral circuitry receives dedicated power for the DLL peripheral circuitry.

In additional embodiments, a semiconductor memory device includes a data output path that receives an internal clock and data to be output and that synchronizes the data to the internal clock and outputs the synchronized data. A DLL receives an external clock and generates the internal clock therefrom, the DLL including a variable delay line that delays the internal clock with respect to the external clock in response to a delay control signal, and DLL peripheral circuitry that generates the delay control signal from the external clock and a feedback clock that is derived from the internal clock compensated for a delay time of the data output path. The device further includes a general-purpose power pad that receives general-purpose power to supply the general-purpose power to the data output path, a variable delay line power pad that receives dedicated power for variable delay line so as to supply the power to the variable delay line, and a peripheral circuitry power pad that receives dedicated power for peripheral circuitry so as to supply the power to the DLL peripheral circuitry.

DETAILED DESCRIPTION

The present invention now will be described more fully with reference to the accompanying drawings, in which embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like reference numerals refer to like elements throughout.

Figure 4:
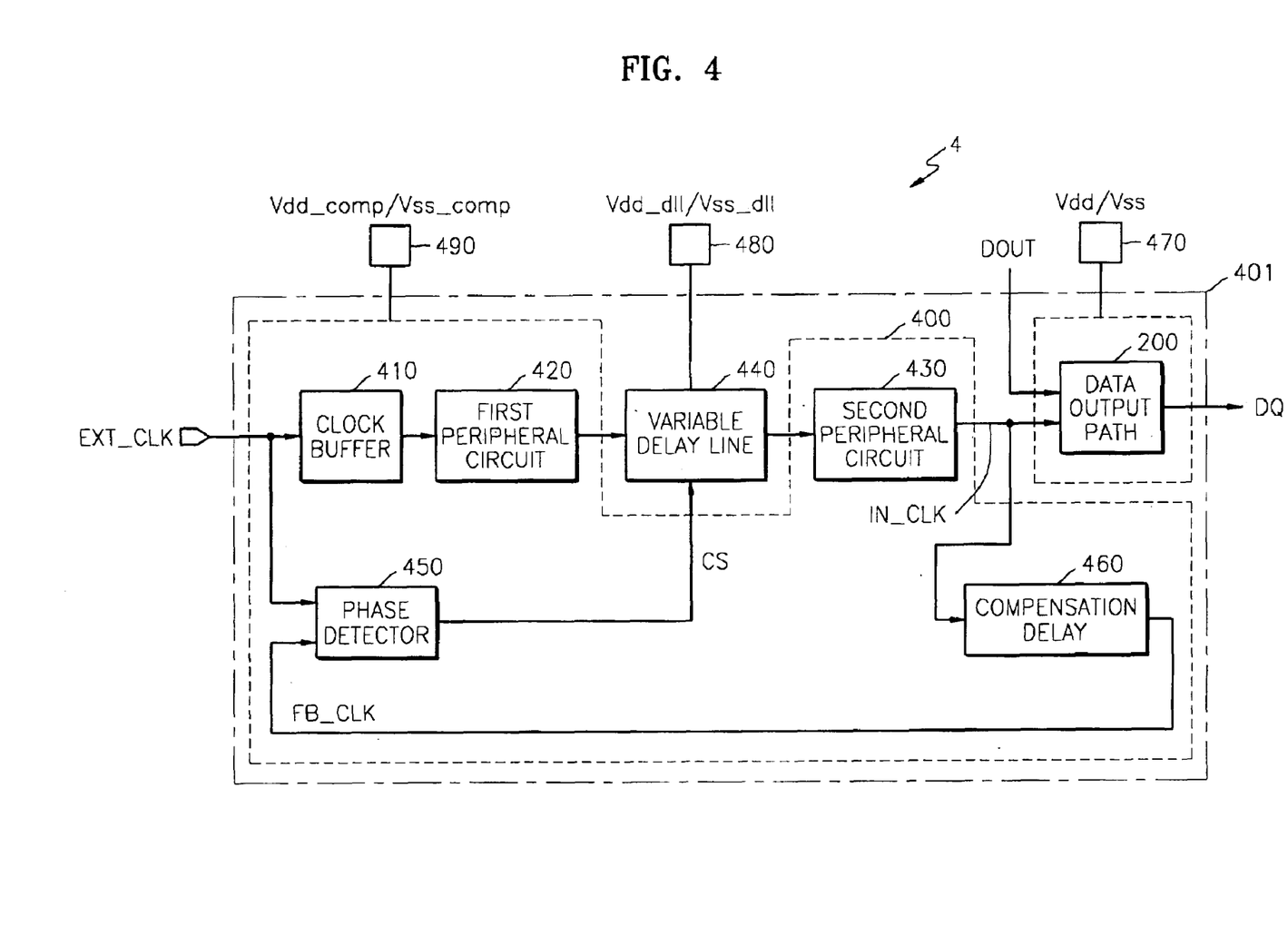
FIG. 4 is a block diagram illustrating a semiconductor memory device according to some embodiments of the present invention.

FIG. 4 is a block diagram illustrating portions of a semiconductor memory device 4 according to some embodiments of the present invention. The semiconductor memory device 4 includes a delay locked loop circuit 401 including a variable delay line 440 and DLL peripheral circuitry 400, and a data output path 200. The semiconductor memory device 4 further includes a general-purpose power pad 470, a variable delay line power pad 480, and a peripheral circuitry power pad 490.

The data output path 200 receives an internal clock IN_CLK and data DOUT, which is read from a memory cell (not shown for purposes of clarity of illustration) of the memory device 4 to be output to the outside of the device 4. The data output path 200 locks (synchronizes) the data DOUT to the internal clock IN_CLK and outputs the data DOUT through a data pin.

The variable delay line 440 and DLL peripheral circuitry 400 receive an external clock EXT_CLK input from the outside to generate the internal clock IN_CLK. The portions. The variable delay line 440 delays the internal clock IN_CLK with respect to the external clock EXT_CLK in response to a predetermined delay control signal CS, so that the phase of the internal clock IN_CLK leads that of the external clock EXT_CLK. The DLL peripheral circuitry 400, which includes a clock buffer 410, a phase detector 450, and a compensation delay 460, generates the delay control signal CS and compensates for the delay time of the data output path 200 by using the external clock EXT_CLK and a feedback clock FB_CLK.

The clock buffer 410 buffers the external clock EXT_CLK input from the outside. The compensation delay 460 produces the feedback clock FB_CLK such that it is delayed with respect to the internal clock IN_CLK generated from the variable delay line 440 by a predetermined delay time. The phase detector 450 generates the delay control signal CS by comparing the external clock EXT_CLK and feedback clock FB_CLK so as to adjust the delay time of the variable delay line 440.

The DLL peripheral circuitry 400 may further include circuits for adjusting the levels of the clocks, including a first peripheral circuit 420 that receives the output signal of the clock buffer 410 for outputting a signal to the variable delay line 440, and a second peripheral circuit 430 that receives an output signal of the variable delay line 440 and outputs the internal clock IN_CLK.

The delay time of the variable delay line 440 is varied according to the delay control signal CS, generated by the phase detector 450. The delayed clock signal from the variable delay line 440 is applied to the second peripheral circuit 430 to generate the internal clock IN_CLK. The internal clock IN_CLK is input to the data output path 200. The data output path 200 locks (synchronizes) the data DOUT from the memory cell to the internal clock IN_CLK and outputs the data DOUT to the outside through the data pin.

In order to lock the phase of output data DQ from the data output path 200 to that of the external clock EXT_CLK, the internal clock IN_CLK is fed back to the phase detector 450 via the feedback clock FB_CLK generated by the compensation delay 460. The phase detector 450 compares the external clock EXT_CLK and the feedback clock FB_CLK and adjusts the delay time of the variable delay line 440 according to the result of the comparison.

It is preferable that the delay times of the data output path 200 and the compensation delay 460 are substantially the same, and that the delay times of the data output path 200 and the compensation delay 460 do not substantially vary with changes in power supply. However, as the number of output data pins increases, power consumption of the data output path 200 can increase greatly, which can cause power loss and noise and, in turn, variance in the power supply level.

In some embodiments of the present invention, independent paths for supplying external power to the data output path 200, the variable delay line 440, and the DLL peripheral circuitry 400 are provided, so that power loss and noise in the data output path 200 do not substantially affect DLL characteristics. In particular, dedicated power for variable delay line Vdd_dll/Vss_dll is supplied to the variable delay line 440, and dedicated power for DLL peripheral circuitry Vdd_comp/Vss_comp is supplied to the DLL peripheral circuitry 400. The semiconductor memory device according to embodiments of the present invention illustrated in FIG. 4 includes dedicated power supply pads 470, 480, and 490 for respective ones of the circuits 200, 440, and 400, to independently supply external power to the data output path 200, the variable delay line 440, and the DLL peripheral circuitry 400. In particular, the data output path 200 receives general-purpose power (Vdd/Vss) through a general-purpose power pad 470, the variable delay line 440 receives dedicated power (Vdd_dll/Vss_dll) for variable delay line through a variable delay line power pad 480, and the DLL peripheral circuitry 400 receives dedicated power (Vdd_comp/Vss_comp) for DLL peripheral circuitry through a peripheral circuitry power pad 490.

More than one power supply voltage may be supplied to each of the data output path 200, the variable delay line 440, and the DLL peripheral circuitry 400. Consequently, each of the data output path 200, the variable delay line 440, and the DLL peripheral circuitry 400 may have two or more associated power pads to receive multiple power supply voltages.

In general, when the data output path 200 is operated, the internal power supply may decrease and/or noise may occur, due to limits in the external power supply. In the embodiments illustrated in FIG. 4, the data output path 200, the variable delay line 440, and the DLL peripheral circuitry 400 each receive dedicated power, so that the internal power supply voltage drop and the noise in the data output path 200 do not substantially effect the compensation delay 460 of the DLL peripheral circuitry 400. Consequently, fluctuations in power supply to the data output path 200 do not substantially affect the feedback clock FB_CLK, which is input to the phase detector 450 through the clock buffer 410, the variable delay line 440, and the compensation delay 460 and compared to the external clock EXT_CLK. As a result, the DLLs 400 and 440 may maintain synchronization in the presence of power drop and noise in the data output path 200.

Figure 5:
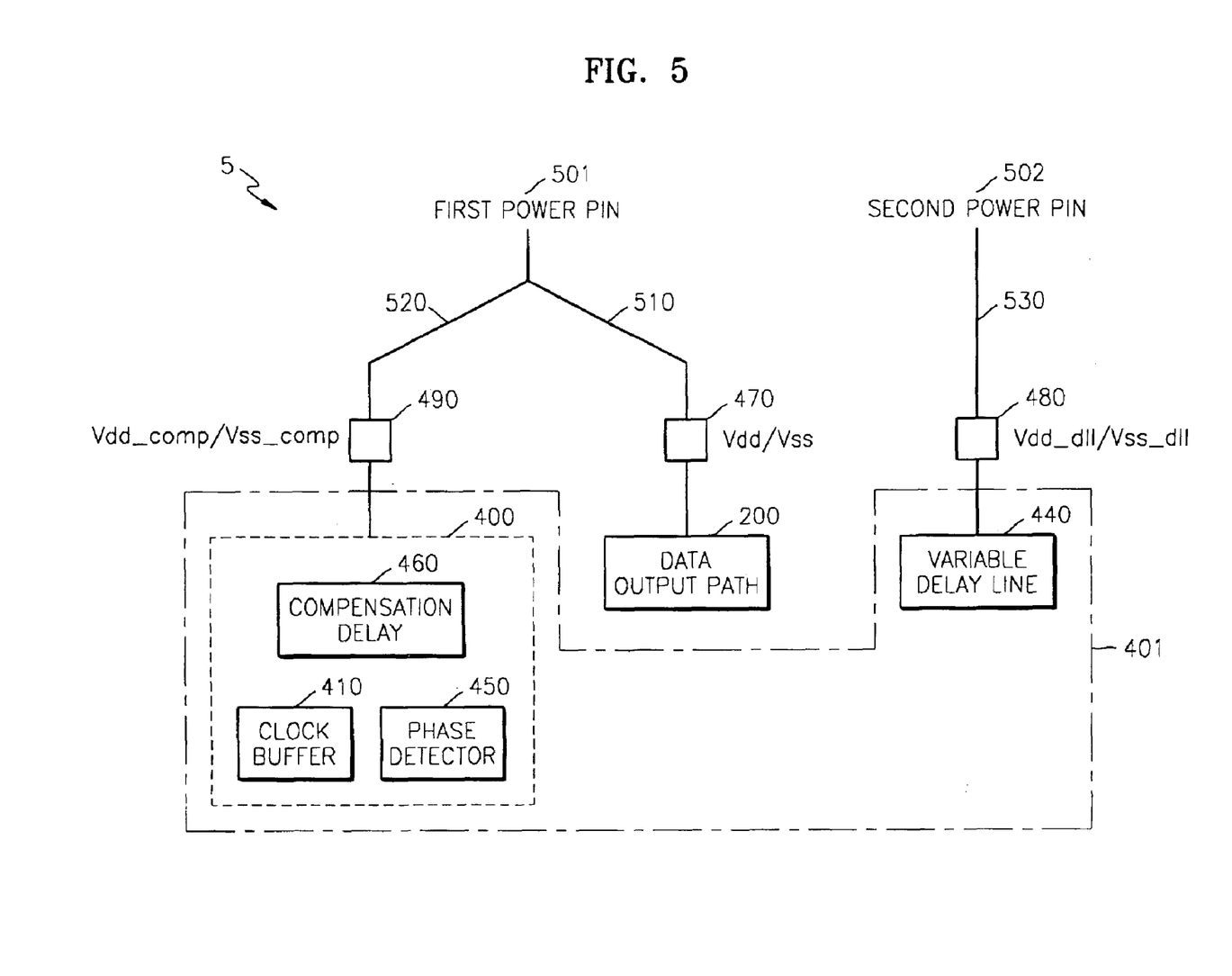
FIG. 5 illustrates a power supply configuration in a semiconductor memory device according to further embodiments of the present invention.

FIG. 5 illustrates a semiconductor memory device 5 according to second embodiments of the present invention. The semiconductor memory device 5 includes a DLL circuit 401 including a variable delay line 440 and DLL peripheral circuitry 400, a data output path 200, a general-purpose power pad 470, a variable delay line power pad 480, and a peripheral circuitry power pad 490. The DLL peripheral circuitry 400 includes a clock buffer 410, first and second peripheral circuits 420 and 430, a phase detector 450, and a compensation delay 460. These components of the memory device 5 are the same as components of the memory device 4 of FIG. 4 bearing the same reference numerals. Therefore, further detailed descriptions of these components of the semiconductor memory device 5 will not be provided.

The semiconductor memory device 5 further includes first and second power pins 501, 502. The first power pin 501 inputs external power to the general-purpose and peripheral circuitry power pads 470 and 490, and the second power pin 502 inputs the external power to the variable delay line power pad 480. Therefore, one pin, namely, the first power pin 501 for supplying the external power to the data output path 200 and the DLL peripheral circuitry 400, is shared. Lead frames 510 and 520 respectively connect the first power pin 501 to the general-purpose power pad 470 and the peripheral circuitry power pad 490, while separate lead frame 530 couples the variable delay line pad 480 to the second power supply pin 502.

Figure 6:
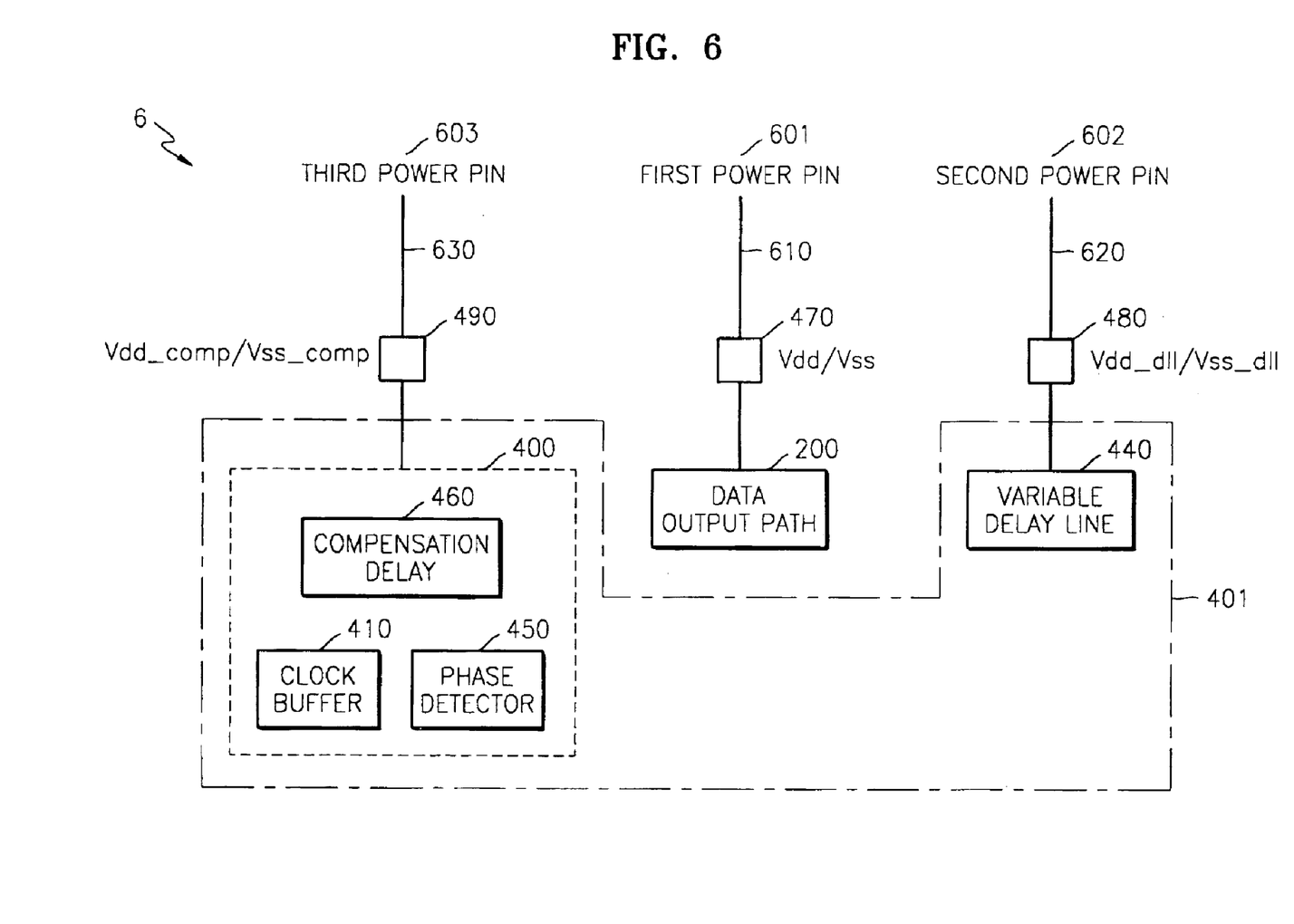
FIG. 6 illustrates a power supply configuration in a semiconductor memory device according to still further embodiments of the present invention.

FIG. 6 illustrates a semiconductor memory device 6 according to third embodiments of the present invention. The semiconductor memory device 6 includes a DLL circuit 401 including a variable delay line 440 and DLL peripheral circuitry 400, a data output path 200, a general-purpose power pad 470, a variable delay line power pad 480, and a peripheral circuitry power pad 490. The DLL peripheral circuitry 400 includes a clock buffer 410, first and second peripheral circuits 420 and 430, a phase detector 450, and a compensation delay 460. These components of the memory device 6 are the same as components of the memory device 4 of FIG. 4 bearing the same reference numerals. Therefore, further detailed descriptions of these components of the semiconductor memory device 6 will not be provided.

The semiconductor memory device 6 further includes first through third power pins 601, 602, 603. The first, second, and third power pins 601, 602, 603 respectively input external power to the general-purpose power pad 470, the variable delay line power pad 480, and the peripheral circuitry power pad 490. In the semiconductor memory device 6, the first through third power pins 601, 602, 603 for supplying the external power to the data output path 200, the variable delay line 440, and the DLL peripheral circuitry 400 are independent of one another. Lead frames 610, 630, and 620 respectively connect the power pins 601, 602, 603 to the pads 470, 480, and 490.

Figure 7:
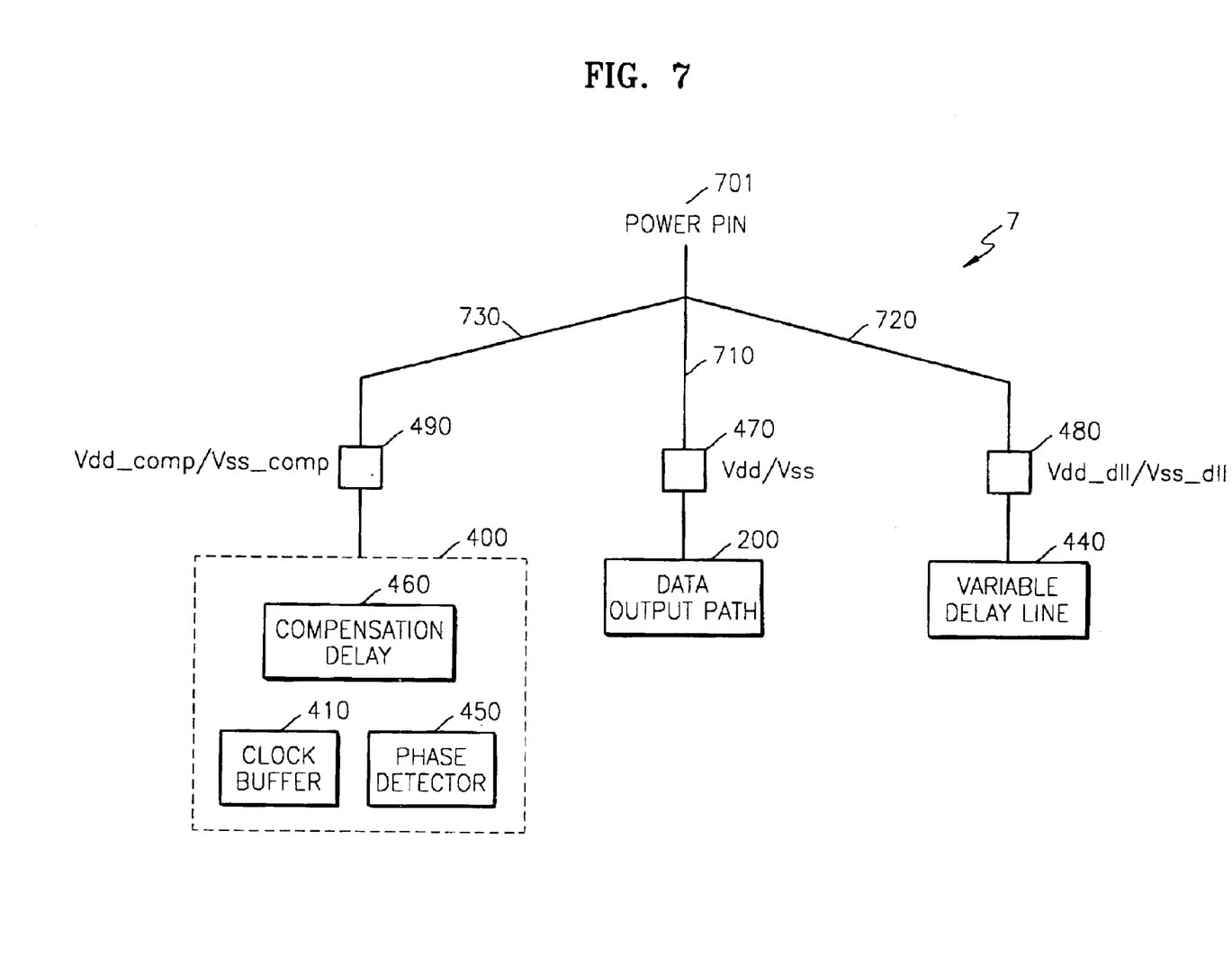
FIG. 7 illustrates a power supply configuration in a semiconductor memory device according to additional embodiments of the present invention.

FIG. 7 illustrates a semiconductor memory device 7 according to fourth embodiments of the present invention. The semiconductor memory device 7 includes a DLL circuit 401 including DLLs a variable delay line 440 and DLL peripheral circuitry 400, a data output path 200, a general-purpose power pad 470, a variable delay line power pad 480, and a peripheral circuitry power pad 490. The DLL peripheral circuitry 400 includes a clock buffer 410, first and second peripheral circuits 420 and 430, a phase detector 450, and a compensation delay 460. These components of the memory device 7 are the same as components of the memory device 4 of FIG. 4 bearing the same reference numerals. Therefore, further detailed descriptions of these components of the semiconductor memory device 7 will not be provided.

The semiconductor memory device 7 further includes a common power pin 701 for inputting external power to the general-purpose power pad 470, the variable delay line power pad 480, and the peripheral circuitry power pad 490. Accordingly, the power pin 701 for supplying the external power to the data output path 200, the variable delay line 440, and the DLL peripheral circuitry 400 is shared, while the pads 470, 480, and 490 are independently arranged. Respective lead frames 710, 720, and 730 couple the power pin 701 to the pads 470, 480, and 490.

According to various embodiments of the present invention, power supply to circuitry of the DLLs other than the variable delay line is separated from power supply to other circuitry of the semiconductor memory device including the data output path. This can prevent power loss and noise generated in the data output path from affecting peripheral circuitry of the DLLs, and can greatly reduce jitter in the DLLs.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A memory device, comprising:
   first, second and third power supply pads configured to be connected to a power supply;
   a data output circuit that receives power via the first power supply pad and outputs data responsive to an internal clock signal; and
   a delay-locked loop (DLL) circuit that generates the internal clock signal responsive to an external clock signal, the DLL circuit comprising a variable delay circuit that has a power supply input that receives power via the third power supply pad and that variably delays the internal clock signal with respect to the external clock signal responsive to a delay control signal and a DLL control circuit that has a power supply input that receives power from the second power supply pad and that generates the delay control signal.

2. A memory device according to claim 1:
   wherein the DLL circuit comprises:
   a compensation delay circuit that produces a feedback clock signal responsive to a delayed clock signal produced by the variable delay circuit; and
   a phase detector circuit that generates the delay control signal responsive to a comparison of the feedback clock signal and the external clock signal;
   wherein the variable delay circuit variably delays the internal clock signal with respect to the external clock signal responsive to the delay control signal; and
   wherein the compensation delay circuit and the phase detector circuit are powered via the second power supply pad.

3. A memory device according to claim 1, wherein the first and second power supply pads are coupled to a first power supply pin by respective first and second lead frames, and wherein the third power supply pad is coupled to a second power supply pin by a third lead frame.

4. A memory device according to claim 1, wherein the first, second and third power supply pads are coupled to respective first, second and third power supply pins by respective first, second and third lead frames.

5. A memory device according to claim 1, wherein the first, second and third power supply pins are coupled to the same power supply pin by respective first, second and third lead frames.

6. A semiconductor memory device comprising:
   a data output path that receives an internal clock and data to be output and that synchronizes the data to the internal clock and outputs the synchronized data; and
   a delay locked loop (DLL) that receives an external clock and generates the internal clock, the DLL including a variable delay line which delays the internal clock with respect to the external clock in response to a delay control signal and DLL peripheral circuitry that generates the delay control signal from the external clock and a feedback clock that is derived from the internal clock and compensated for delay time of a data output circuit of the data output path,
   wherein the variable delay line has a power supply input that receives power from a first power supply pad, and the DLL peripheral circuitry has a power supply input that receives power from a second power supply pad.

7. The semiconductor memory device of claim 6, wherein the DLL peripheral circuitry includes:
   a clock buffer that buffers the external clock;

a compensation delay that delays the internal clock for a predetermined compensation delay time to generate the feedback clock; and a phase detector that compares the external clock and the feedback clock to generate the delay control signal.

8. The semiconductor memory device of claim 6, further including:

a general-purpose power pad that receives general-purpose power to supply the power to the data output path;

a variable delay line power pad that receives dedicated power for variable delay line; and a peripheral circuitry power pad that receives dedicated power for DLL peripheral circuitry, wherein the general-purpose power pad, the variable delay line power pad, and the peripheral circuitry power pad are independent of one another.

9. The semiconductor memory device of claim 8, further including:

a first power pin that inputs external power to the general-purpose power pad as general-purpose power;

a second power pin that inputs the external power to the variable delay line power pad as dedicated power for variable delay line; and a third power pin that inputs the external power to the peripheral circuitry power pad as dedicated power for DLL peripheral circuitry.

10. The semiconductor memory device of claim 8, further including:

a first power pin that inputs external power to the general-purpose power pad and the peripheral circuitry power pad, as general-purpose power and dedicated power for peripheral circuitry, respectively; and a second power pin that inputs the external power to the variable delay line power pad as dedicated power for variable delay line.

11. The semiconductor memory device of claim 8, further including a power pin that inputs external power to the general-purpose power* pad, the peripheral circuitry power pad, and the variable delay line power pad, as general-purpose power, dedicated power for peripheral circuitry, and dedicated power for variable delay line, respectively.

12. A semiconductor memory device comprising:

a data output path that receives an internal clock and data to be output and that synchronizes the data to the internal clock and outputs the synchronized data;

a DLL that receives an external clock and generates the internal clock therefrom, the DLL including a variable delay line that delays the internal clock with respect to the external clock in response to a delay control signal, and DLL peripheral circuitry that generates the delay control signal from the external clock and a feedback clock that is derived from the internal clock compensated for a delay time of a data output circuit of the data output path;

a general-purpose power pad that receives general-purpose power to supply the general-purpose power to the data output path;

a variable delay line power pad that receives dedicated power for variable delay line so as to supply the power to the variable delay line; and a peripheral circuitry power pad that receives dedicated power for peripheral circuitry so as to supply the power to the DLL peripheral circuitry.

13. The semiconductor memory device of claim 12, further including:

a first power pin electrically connected to both the general-purpose power pad and the peripheral circuitry power pad; and a second power pin electrically connected to the variable delay line power pad.

14. The semiconductor memory device of claim 12, further including:

a first power pin electrically connected to the general-purpose power pad;

a second power pin electrically connected to the variable delay line power pad; and a third power pin electrically connected to the peripheral circuitry power pad.

15. The semiconductor memory device of claim 12, further including a power pin electrically connected to the general-purpose power pad, the variable delay line power pad, and the peripheral circuitry power pad.

16. The semiconductor memory device of claim 12, wherein the DLL peripheral circuitry further includes:

a clock buffer that buffers the external clock;

a compensation delay that delays the feedback clock with respect to the internal clock for a predetermined compensation delay time; and a phase detector that compares the external clock and the feedback clock and that responsively generates the delay control signal.

* * * * *